United States Patent [19]
Chang et al.

[11] Patent Number: 6,066,862
[45] Date of Patent: May 23, 2000

[54] HIGH BRIGHTNESS LIGHT EMITTING DIODE

[75] Inventors: Pan-Tzu Chang, Taipei; Chuan-Cheng Tu, TaiNan; Tzer-Perng Chen, HsinChu, all of Taiwan

[73] Assignee: United Epitaxy Company, Ltd., Hsinchu, Taiwan

[21] Appl. No.: 09/144,357

[22] Filed: Aug. 31, 1998

[51] Int. Cl.[7] .......................... H01L 27/15; H01L 31/12; H01L 33/00

[52] U.S. Cl. .......................... 257/103; 257/101

[58] Field of Search ..................... 257/103, 101

[56] References Cited

U.S. PATENT DOCUMENTS 5,008,718  4/1991  Fletcher et al. .
5,300,791  4/1994  Chen et al. .
5,359,209  10/1994 Huang .
5,606,180  2/1997  Hosoi et al. .
5,917,201  6/1999  Ming-Siann et al. .

*Primary Examiner*—Stephen D. Meier

[57] ABSTRACT

A semiconductor light emitting diode includes a first conductivity type compound semiconductor substrate, a first conductivity type lower cladding layer, an active layer of undoped AlGaInP or multiple quantum well structure, and a second conductivity type upper cladding structure. The upper cladding structure comprises an $(Al_xGa_{1-x})_yIn_{1-y}P$ four element compound semiconductor material. The improvement is that the upper cladding structure has a thin and very high resistivity layer inside.

12 Claims, 2 Drawing Sheets

HIGH BRIGHTNESS LIGHT EMITTING DIODE

FIELD OF THE INVENTION

This invention relates to a semiconductor light emitting device, and more specifically to an AlGaInP light emitting device.

BACKGROUND OF THE INVENTION $(Al_xGa_{1-x})_{0.51}In_{0.49}P$ quaternary compound is a direct bandgap semiconductor material which is lattice matched to a GaAs substrate. The compound has high radiative recombination efficiency in the wavelength range from 560 nm to 650 nm and is a good candidate for fabricating high brightness light emitting diodes for emitting light of red to yellow green color.

FIG. 1 illustrates the cross-sectional view of a conventional AlGaInP light emitting diode comprising an n-type GaAs substrate 100, an n-type AlGaInP lower cladding layer 101, an undoped AlGaInP active layer 102, and a p-type AlGaInP upper cladding layer 103. Because it is difficult to heavily dope the AlGaInP material in p-type, the upper cladding layer 103 has high resistivity that restricts the current flow just underneath the top metal electrical contact of the light emitting diode. Therefore, the emitted light generated from the active region underneath the top metal electrical contact is mostly absorbed by the opaque top electrical contact. The luminous intensity of this kind of light emitting diode is not very high.

In order to promote current spreading, U.S. Pat. No. 5,008,718 adopts a high energy band gap GaP transparent window layer which has low resistivity to help distributing the current uniformly across the active layer. Because the window layer used is a heavily doped p-type GaP material which has a very low mobility, its resistivity is only about one order of magnitude lower than that of the upper cladding layer. Therefore, a window layer with substantial thickness is necessary for improving the current spreading.

A thick transparent window layer not only takes a long time to grow but also costs more. To reduce the window layer thickness, U.S. Pat. No. 5,359,209 discloses a double layer window structure including a low energy band gap heavily doped p-type GaAs layer and a high energy band gap GaP layer. The heavily doped p-type GaAs layer has a very low resistivity which is about two orders of magnitude lower than that of the upper cladding layer.

Because of the low resistivity in the heavily doped p-type GaAs layer, the overall resistivity of the double layer window structure becomes much lower. The total thickness of the window structure can be significantly reduced. However, the inclusion of this thin heavily doped p-type GaAs layer reduces a few percent luminous intensity of the light emitted from the diode because the GaAs layer is opaque.

SUMMARY OF THE INVENTION

Because of the drawbacks in the prior art, it is an object of the present invention to provide a high brightness light emitting diode structure which has high luminous intensity as well as shorter growth time. To accomplish this object, the invention adds a thin layer with very high resistivity in an upper cladding structure. According to the invention, the light emitting diode comprises a first conductivity type GaAs substrate, a first conductivity type AlGaInP lower cladding layer, an undoped AlGaInP active layer or an AlGaInP multiple quantum well structure acting as an active layer, and a second conductivity type AlGaInP upper cladding structure. The second conductivity type $(Al_xGa_{1-x})_yIn_{1-y}P$ upper cladding structure includes three layers. The lower layer which is in contact with the active layer comprises $(Al_xGa_{1-x})_yIn_{1-y}P$ with y=0.51 and is lattice matched with the active layer and the GaAs substrate. The middle layer is a very thin and high resistivity layer which can be formed for example by the growth of an $(Al_xGa_{1-x})_yIn_{1-y}P$ compound semiconductor material with aluminum content x close to 1, In content 1-y close to 0 and low doping concentration or without doping. To facilitate the formation of ohmic contact, the upper layer is a high bandgap and high carrier concentration region which can be formed by the growth of the $(Al_xGa_{1-x})_yIn_{1-y}P$ compound semiconductor material with aluminum content close to 0 and In content 1-y close to 0. With this high resistivity middle layer, the injected current is forced to spread uniformly in the upper layer of the upper cladding structure before it passes through the middle layer and lower layer of the upper cladding structure and the active layer. Therefore, the light is generated uniformly from the whole active layer and the luminous intensity of the LED is much improved.

DETAILED DESCRIPTION OF THE PREFERRED EMBODIMENT

Figure 1:
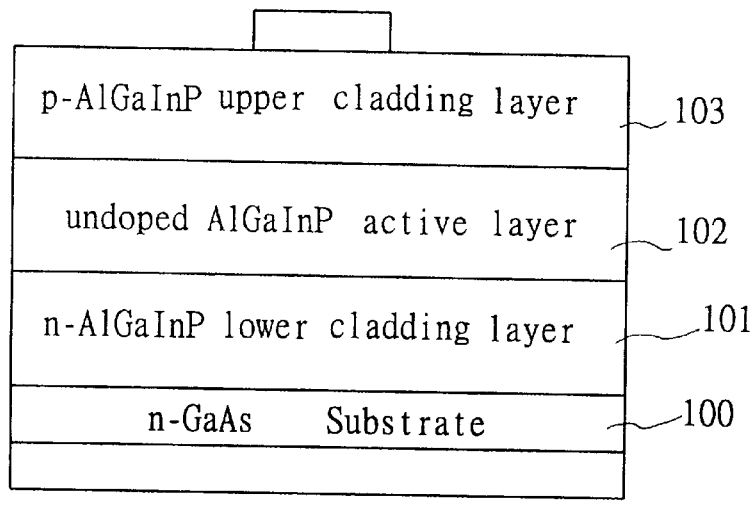
FIG. 1 shows a cross-sectional view of a conventional AlGaInP light emitting diode.
Figure 2:
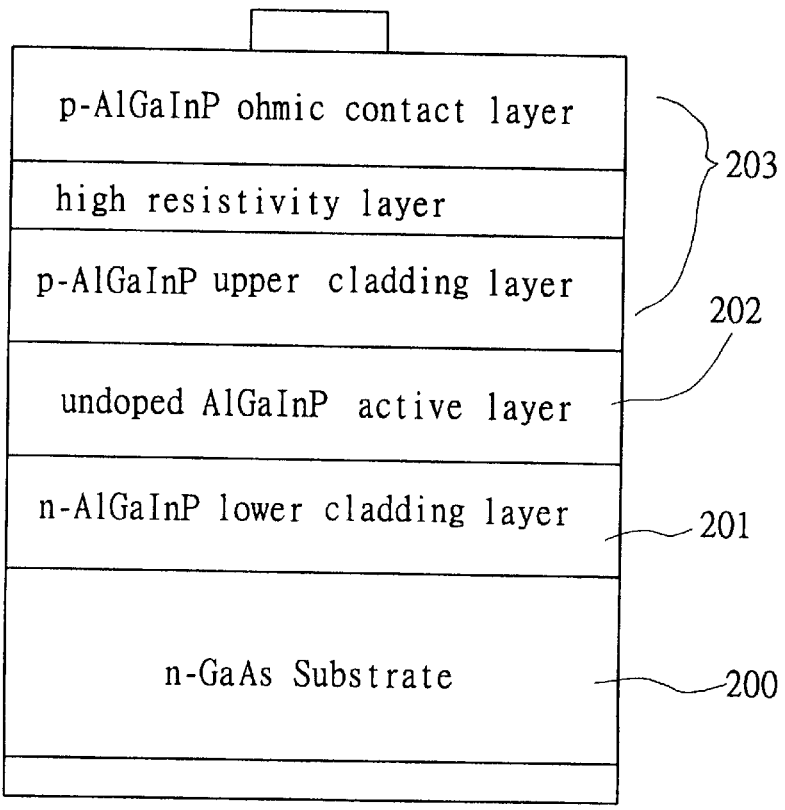
FIG. 2 shows a cross-sectional view of an AlGaInP light emitting diode according a first embodiment of the present invention.
Figure 3:
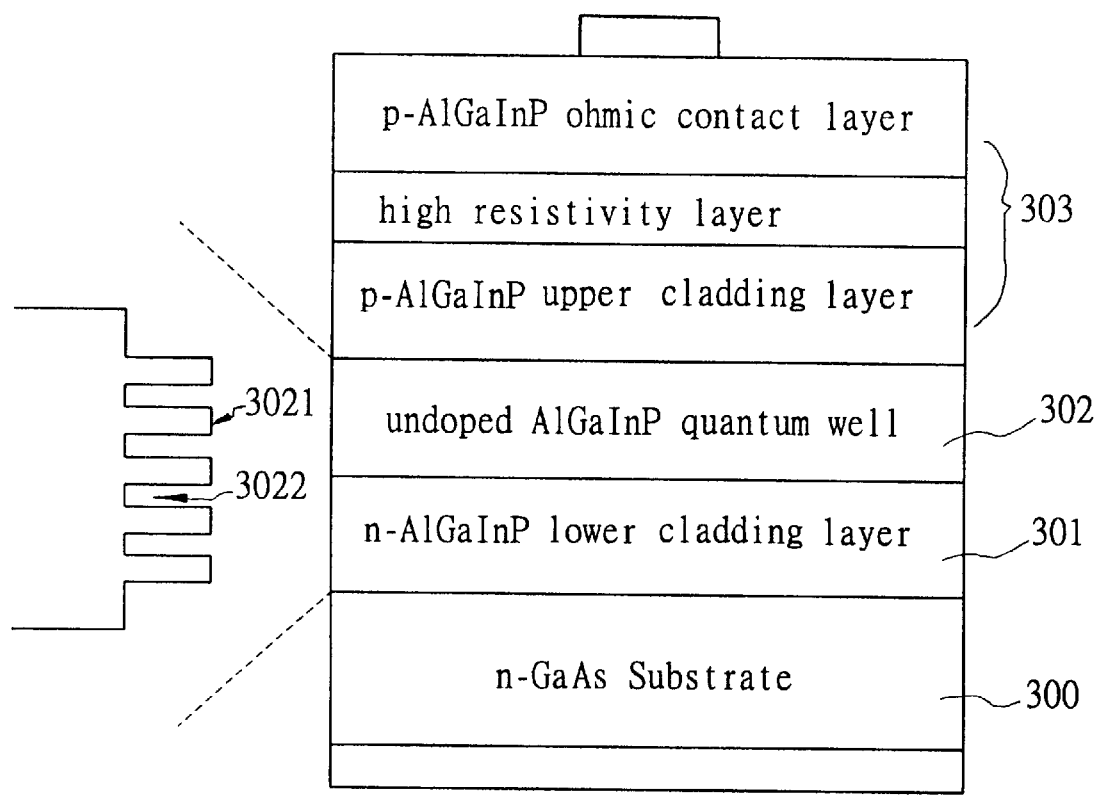
FIG. 3 shows a cross-sectional view of an AlGaInP light emitting diode according to a second embodiment of the present invention.
Figure 3:
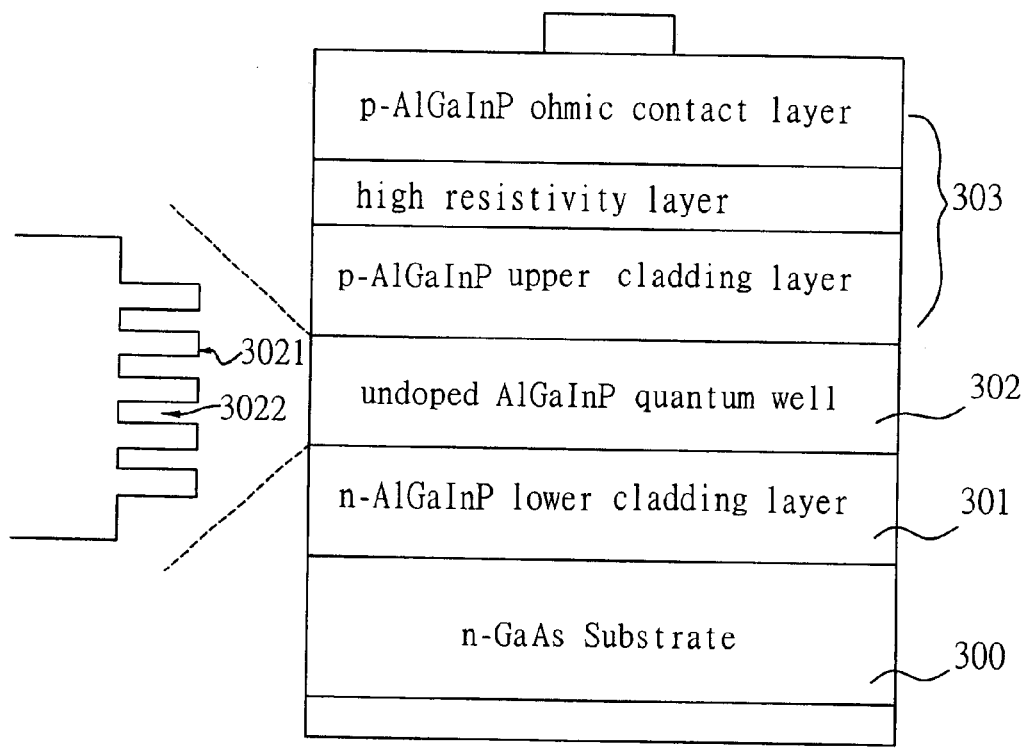

With reference to FIG. 2 and FIG. 3, the structure of the light emitting diode of this invention includes a GaAs substrate 200 of a first conductivity type. A first conductivity type AlGaInP lower cladding layer 201 is grown on the substrate. Above the lower cladding layer is an AlGaInP active layer 202 or an AlGaInP multiple quantum well structure 302 comprising a plurality of alternately stacking quantum well layers 3021 and barrier layers 3022 acting as a light emitting layer as shown in FIG. 3.

The light emitting layer of this invention is made of $(Al_xGa_{1-x})_{0.51}In_{0.49}P$ with x=0–0.4 depending on the emission wavelength. For example, when the aluminum content x is equal to 15%, the emission wavelength of the light emitting diode is about 610 nm. On top of the light emitting layer is a second conductivity type AlGaInP upper cladding structure 203.

The upper cladding structure is a three-layer structure. The lower layer, which is in contact with the light emitting layer, is made of $(Al_xGa_{1-x})_{0.51}In_{0.49}P$ that is lattice matched to the GaAs substrate in order to avoid the generation of dislocation. The Al content of this layer is x=0.7–1 in order to have better electron confining effect. The middle layer is a thin layer with high resistivity. This layer can be formed by several different ways. For example, a thin AlGaP or AlP layer with thickness of about 200 angstroms and low doping concentration can be a suitable high resistivity layer.

In general, the resistivity of the AlGaInP compound semiconductor is higher as the Al content is increased and the carrier concentration is decreased. Therefore, $(Al_xGa_{1-x})_yIn_{1-y}P$ material with high Al content and low In content as well as lower carrier concentration is a good choice for the high resistivity and thin layer. The best composition of this $(Al_xGa_{1-x})_yIn_{1-y}P$ high resistivity layer is $0.7 \leq x \leq 1.0$ and $0.9 \leq y \leq 1.0$.

The optimum thickness of this layer is in the range of 0.005 μm to 0.1 μm. The composition of this high resistivity and thin layer does not need to be constant. An AlGaInP supper-lattice structure such as AlP/GaP or AlGaP/GaP or an AlGaInP layer with its composition grading from $(Al_xGa_{1-x})_{0.51}In_{0.49}P$ to close to AlGaP or AlP can also be used as the high resistivity and thin layer.

The upper layer is an $(Al_xGa_{1-x})_yIn_{1-y}P$ high bandgap low resistivity ohmic contact layer with x close to 0, and $0.7 \leq y \leq 1$. The requirement for this ohmic contact layer is that its bandgap must be larger than the active layer in order to avoid the light absorption. In addition, it must have higher carrier concentration, therefore, lower resistivity to facilitate the formation of the ohmic contact. It is much easier to dope the AlGaInP compound semiconductor to higher carrier concentration as the Al content is decreased. The best choice is $(Al_xGa_{1-x})_yIn_{1-y}P$ with Al content less than 100%. However, to avoid the light absorption, the indium content must be less than 300%.

With this high resistivity middle layer and low resistivity upper layer in the upper cladding structure, the injected current from the top ohmic contact is forced to spread uniformly in the low resistivity upper layer before passing through the middle layer and the lower layer into the light emitting layer. With the addition of this high resistivity layer, the thickness of the upper high bandgap and low resistivity layer can be reduced as compared to the prior art. The thickness of this high bandgap ohmic contact layer is in the range of 0.5 μm to 10 μm. The only penalty with the addition of this high resistivity and thin layer is a little increase of the forward voltage.

The luminous intensity of the light emitting diode of the present invention is significantly improved. Specific examples of the present invention are described in the following.

EXAMPLE 1:

A light emitting diode structure according to the present invention was grown on an n-type [100] GaAs substrate with a mis-orientation of 2° towards the [111] direction and carrier concentration of $1 \times 10^{18}$ cm$^{-3}$. The thickness of the GaAs substrate is about 350 μm. First, an n-type GaAs buffer layer with carrier concentration of $1 \times 10^8$ cm$^{-3}$ was grown on the substrate. An 1 μm n-type AlInP lower cladding layer was then grown above the buffer layer.

Above the lower cladding layer is an undoped AlGaInP multiple quantum well structure acting as a light emitting layer. The undoped AlGaInP multiple quantum well structure comprises a 0.1 μm (AlGa)InP lower carrier confinement layer, a plurality of (AlGa)InP quantum well layers and (AlGa)InP barrier layers alternatively stacking one after another, and another 0.1 μm (AlGa)InP upper carrier confinement layer.

On top of the multiple quantum well structure is the p-type (AlGa)InP upper cladding structure which comprises an 1 μm p-type AlInP layer, a 200 angstrom high resistivity AlGaP layer and a 5 μm heavily doped p-type $In_{0.1}Ga_{0.9}P$ ohmic contact layer.

For comparison, a prior art light emitting diode without the high resistivity layer was also prepared. The light emitting diodes for both the prior art and the present invention were processed into chips and injected with 20 mA current. It was found that the current spreading of the light emitting diode of the present invention was very good because the light coming out of the chip was very uniform.

The luminous intensities of the light emitting diodes are about 40 mcd and 65 mcd for the prior art and the present invention respectively in the wavelength range of 590 nm to 615 nm. The forward voltage of the present invention is 2.2 volts which is about 0.2 volts higher than that of the prior art.

The luminous intensity of the present invention can be further improved by including a distributed Bragg reflector (DBR) between the GaAs substrate and the active layer to reflect the light which would otherwise be absorbed by the GaAs substrate. An example is illustrated as below.

EXAMPLE 2:

A light emitting diode structure according to the present invention was grown on an n-type [100] GaAs substrate with a mis-orientation of 2° towards the [111] direction and carrier concentration of $1 \times 10^{18}$ cm$^{-3}$. The thickness of the GaAs substrate is about 350 μm. First, an n-type GaAs buffer layer with carrier concentration of $1 \times 10^{18}$ cm was grown on the substrate.

A twelve pairs of AlAs/GaAs distributed Bragg reflector was then grown on the GaAs buffer layer. An 1 μm n-type AlInP lower cladding layer was then grown above the distributed Bragg reflector. Above the lower cladding layer is an undoped AlGaInP multiple quantum well structure acting as a light emitting layer. The undoped AlGaInP multiple quantum well structure comprises a 0.1 μm (AlGa)InP lower carrier confinement layer, a plurality of (AlGa)InP quantum well layers and (AlGa)InP barrier layers alternatively stacking one after another, and another 0.1 μm (AlGa)InP upper carrier confinement layer.

On top of the multiple quantum well structure is the p-type (AlGa)InP upper cladding structure which comprises an 1 μm p-type AlInP layer, three pairs of GaP/AlP supper-lattice structure acting as a high resistivity layer, and a 5 μm heavily doped p-type $In_{0.05}Ga_{0.95}P$ ohmic contact layer. For comparison, two consecutive MOVPE runs with different thickness of the supper-lattice layers were grown. The thickness of each supper-lattice layer for these two consecutive runs is 45 angstroms and 80 angstroms respectively. The luminous intensities of these two AlGaInP LEDs are both 95 mcd but the forward voltages are 2.15 volts and 3.3 volts for 45 angstroms and 80 angstroms thick supper-lattice layers respectively.

In summary, the present invention with the addition of a high resistivity and thin layer inside the upper cladding structure can significantly increase the luminous intensity of the light emitting diode over the prior art by 1.5 to 2 times. The only penalty is a little increase in the forward voltage. However, the present invention needs only one step MOVPE growth and the thickness of the top high band gap ohmic contact layer can be reduced. Therefore, the present invention also has the merits of easy growth and lower cost.

What is claimed is:

1. A light emitting diode comprising:
   a semiconductor substrate of a first conductivity type;
   a lower cladding layer of AlGaInP of said first conductivity type formed on said substrate;
   an active layer of undoped AlGaInP formed on said lower cladding layer; and an upper cladding structure comprising:
   a first layer of AlGaInP of a second conductivity type, which is lattice matched to said substrate, formed on said active layer;

a second layer of AlGaInP of said second conductivity type formed on said first layer, said second layer having sufficiently small thickness and low doping concentration for providing high resistivity;

and an ohmic contact layer of $(Al_xGa_{1-x})_yIn_{1-y}P$ of said second conductivity type with $0 \leq x \leq 0.1$ and $0.7 \leq y \leq 1$ formed on said second layer.

2. The light emitting diode according to claim 1, wherein said semiconductor substrate comprises GaAs.

3. The light emitting diode according to claim 1, wherein said second layer comprises an $(Al_sGa_{1-s})_tIn_{1-t}P$ semiconductor material with $0.7 \leq s \leq 1$, and $0.9 \leq t \leq 1$.

4. The light emitting diode according to claim 1, wherein said second layer comprises a supper-lattice of (AlGa)InP.

5. The light emitting diode according to claim 1, wherein said second layer comprises a layer of (AlGa)InP having grading composition.

6. The light emitting diode according to claim 1, wherein the thickness of said second layer is in the range from 0.005 μm to 0.1 μm.

7. A light emitting diode comprising:

a semiconductor substrate of a first conductivity type;

a lower cladding layer of AlGaInP of said first conductivity type formed on said substrate;

an active layer of undoped AlGaInP multiple quantum well formed on said lower cladding layer, said multiple quantum well structure comprising a plurality of (AlGa)InP quantum well layers and (AlGa)InP barrier layers alternatively stacking one after the other;

an upper cladding structure comprising:

a first layer of AlGaInP of a second conductivity type, which is lattice matched to said substrate, formed on said active layer;

a second layer of AlGaInP of said second conductivity type formed on said first layer, said second layer having sufficiently small thickness and low doping concentration for providing high resistivity;

and an ohmic contact layer of $(Al_xGa_{1-x})_yIn_{1-y}P$ of said second conductivity type with $0 \leq x \leq 0.1$ and $0.7 \leq y \leq 1$ formed on said second layer.

8. The light emitting diode according to claim 7, wherein said semiconductor substrate comprises GaAs.

9. The light emitting diode according to claim 7, wherein said second layer comprises an $(Al_sGa_{1-s})_tIn_{1-t}P$ compound semiconductor material with $0.7 \leq s \leq 1$, and $0.9 \leq t \leq 1$.

10. The light emitting diode according to claim 7, wherein said second layer comprises a supper-lattice of (AlGa)InP.

11. The light emitting diode according to claim 7, wherein said second layer comprises a layer of (AlGa)InP having grading composition.

12. The light emitting diode according to claim 7, wherein the thickness of said second layer is in the range from 0.005 μm to 0.1 μm.

* * * * *

UNITED STATES PATENT AND TRADEMARK OFFICE
CERTIFICATE OF CORRECTION

PATENT NO. : 6,066,862
DATED : May 23, 2000
INVENTOR(S) : Chang et al.

It is certified that error appears in the above-identified patent and that said Letters Patent is hereby corrected as shown below:

Delete drawing figure 3, and substitute therefor attached drawing figure 3.

<u>Column 3,</u>
Line 21, change "100" to -- 10 --.
Line 23, change "300" to -- 30 --.

Signed and Sealed this

Seventh Day of October, 2003

JAMES E. ROGAN
*Director of the United States Patent and Trademark Office*